United States Patent

[11] 3,577,140

[72] Inventor Hans Bent Aasnaes
Trondheim, Norway

[21] Appl. No. 649,161
[22] Filed June 27, 1967
[45] Patented May 4, 1971
[73] Assignee International Business Machines Corporation
Armonk, N.Y.

[54] TRIPLE INTEGRATING RAMP ANALOG TO DIGITAL CONVERTER
14 Claims, 6 Drawing Figs.

[52] U.S. Cl. .......... 340/347
[51] Int. Cl. .......... H03k 13/02, H03k 13/20
[50] Field of Search .......... 340/347; 235/150.53

[56] References Cited

UNITED STATES PATENTS

| | | | |
|---|---|---|---|
| 3,051,939 | 8/1962 | Gilbert | 340/347 |
| 3,313,924 | 4/1967 | Schulz et al. | 235/150.51 |
| 3,322,942 | 5/1967 | Gerard et al. | 235/183 |
| 3,296,613 | 1/1967 | Andersen et al. | 340/347 |

*Primary Examiner*—Maynard R. Wilbur
*Assistant Examiner*—Gary R. Edwards
*Attorney*—Hanifin and Pancin and Bernard A. Meany

ABSTRACT: An integrating ramp voltage type analog-to-digital converter apparatus is disclosed. An unknown analog voltage is integrated for a fixed time period. During subsequent, successive integration of reference voltages, pulses are gated into a partitioned counter, filling the higher order positions in that counter first. The counter then contains a digital representation analog the analog voltage.

*INVENTOR.*
HANS BENT AASNAES

BY

*ATTORNEY*

TRIPLE INTEGRATING RAMP ANALOG TO DIGITAL CONVERTER

BACKGROUND OF THE INVENTION

1. Field of the Invention

Analog-to-digital converters (ADC's) are of several general types. One type known to the prior art is a successive approximation apparatus. Such an apparatus is described in a copending U.S. Pat. Application No. 460,431, filed June 1, 1965 and assigned to IBM. A second type of ADC is an integrating ramp type converter.

2. Description of the Prior Art

In the successive approximation ADC an analog signal is compared to the analog representation of a sequence of digital numbers. When an equality is indicated, the digital number noted is used as the output of the ADC. Successive approximation type analog-to-digital converters offer high conversion speed and high precision operation. However, they use many components and are generally expensive.

In double integrating ramp converters, an unknown analog voltage is integrated for a fixed period of time. Then, a reference voltage of opposite polarity is integrated until a starting ordinate is crossed. During integration of that reference voltage, clock pulses are gated into a counter, thereby giving a digital representation of the analog signal's magnitude. Double integrating ramp converters are less expensive than successive approximation converters in that they use fewer components. They are rather precise, but they are not noted for high speed operation.

What is desired then is an ADC offering the precision of a double integrating ramp converter; the economy of a double integrating ramp converter; but a greatly increased speed of operation. Then, more inputs can be handled per given time period, or a given signal can be sampled more frequently.

Accordingly, it is an object of this invention to provide an improved, integrating ramp voltage type of analog-to-digital converter.

Another object of this invention is to provide an improved integrating ramp voltage type ADC offering an increased speed of operation without sacrificing precision of conversion.

Still another object of this invention is to provide an improved integrating ramp voltage type ADC of the type set forth immediately above without intolerable increasing the cost of the apparatus.

Still another object of this invention is to provide an improved ADC that will enable one to obtain even higher speeds of operation by trading off some precision.

Yet another object of this invention is to provide an improved integrating ramp type ADC incorporating all the advantages of double integrating ramp ADC's and yet operating at significantly higher speeds.

SUMMARY OF THE INVENTION

An analog-to-digital converter is disclosed wherein a digital representation of the magnitude of an analog signal is generated. A plurality of reference voltages are integrated while the time of integration is measured. This measured time is related to the magnitude of the analog signal.

In the preferred embodiment, an integrating circuit operating in response to three distinct voltages and generating three separate ramp outputs is provided. The first voltage is an unknown analog input voltage resulting in a first ramp output; the second voltage is a reference voltage resulting in a second ramp output; and the third voltage resulting in a third ramp output is also a reference voltage but of less magnitude than the second voltage. Two comparator circuits are also provided, each of which is responsive to the output of the integrator. In the preferred embodiment, each comparator circuit is responsive to a ramp voltage generated by the integrator. The first comparator circuit provides an output signal when the ramp voltage, generated by integrating the second (reference) voltage, crosses a predetermined voltage level. The second comparator circuit provides an output signal when the ramp voltage, generated by integrating the third voltage, crosses another predetermined voltage level. The slopes of the second and third ramp outputs are opposite in polarity to that of the first ramp output.

Responsive to these comparator output signals, and cooperating with the remainder of the apparatus, is control circuitry. That circuitry governs the switching of the inputs (i.e., the unknown and the reference voltages). It also gates the flow of clock signals into a counter circuit. The counter circuit is partitioned. The clock signals are first fed into the higher order positions of the counter during integration of the first voltage. In this way, the first voltage is integrated for a precise period of time. The counter is then reset. Clock signals are next fed into the higher order positions of the counter as a ramp is generated by integration of the second voltage. Clock signals are subsequently fed into the lower order positions of the counter during generation of the ramp voltage resulting from integration of the third input signal. At the conclusion of that integration, the counter contains a digital representation of the original analog input signal.

Other embodiments of my invention are possible. For example, one can use more than two reference voltages and still measure the time of their integration. The operation is an extension of that stated previously.

The advantages possessed by my invention are many. It offers the precision of a double integrating ramp ADC at speeds which are orders of magnitude faster than those available in prior art double integrating ramp ADC's. The increased speed becomes available at a cost which is only fractionally greater than that of the prior art double ramp ADC.

With the known prior art double integrating ramp converter, one must count $2^{n+1}$ pulses in the worst case in order to make an $n$-bit conversion. Translating this into an actual example, in order to make a 14-bit conversion using a 10 megacycle (megahertz) clock, one can only accomplish about 300 such conversions per second. By contrast, with the addition of a single comparator and another switch circuit, as taught in this invention, the conversion speed even in the worst case can be increased by a factor of almost 100; that is, one could make about 30,000 such conversions per second. These figures would change (although the ratio of improvement remains the same) if a different clock frequency were used.

Those technical advantages possessed by prior art double integrating ramp ADC's are also possessed by this invention. For example, problems due to the temperature variation in the surrounding atmosphere are lessened; the RC coefficient in the integrator circuitry cancels out. The clock frequency cancels out; therefore, long term drift in the clock circuitry will not introduce any operating errors to the converter. Drift present in one comparator circuit as well as the comparator time delay is of no effect. In addition, drift and time delay in the other comparator is of no effect in the preferred embodiment. There is no need to stabilize the voltage used to provide the first comparison level. The linearity of the converter as a whole becomes better than that of the integrator circuit itself.

Although two reference voltages are needed for the preferred triple integrating ramp embodiment, it is not necessary to add another voltage source. Both reference voltages can be obtained by associating additional resistors with a single reference voltage supply. The single reference voltage is thereby broken down to two reference voltages having different values.

It is also possible to modify the apparatus of my invention so as to operate in a bipolar fashion. That is, analog input voltages of either a positive or a negative polarity can be accommodated in the same apparatus.

In addition, the gate circuitry for providing the analog input voltage and the reference voltages to the integrator circuit are well adapted for field-effect transistors. Field-effect transistors switch rapidly and are currently coming down in cost. This invention can thus take advantage of their known characteristics.

This invention also offers the advantage of being able to trade off speed against precision. If one wants a 14-bit resolution using a 10 megacycle clock, one can obtain a 30,000 conversion per second rate. However, if a 12-bit resolution was satisfactory, the conversion rate could be increased to 60,000 conversions per second. Dropping down to 10-bit resolution, the conversion rate can be increased to 120,000 conversions per second. All these figures are approximate. Also, one can extend my invention to four, five, .....P integrating ramp type converters and improvement in these figures will be noted. The most pronounced improvements, however, are noted when one compares the triple ramp converter to a dual ramp converter on the basis of performance versus cost.

My invention offers these technical or engineering advantages at a slight increase in component cost over the prior art double integrating ramp converter. One need only add a comparator circuit, a tap on the reference voltage, and some control logic for each additional "level" of performance; that is, for a triple ramp, quadruple ramp, etc.

It can then be seen that the multiramp ADC invention of mine offers precision, speed, and economy of operation unavailable in the prior art. Accordingly, the foregoing and other objects, features, and advantages of the invention will be apparent from the following more particular description of preferred embodiments of the invention, as illustrated in the accompanying drawings.

DESCRIPTION OF PREFERRED EMBODIMENTS

Figure 1:
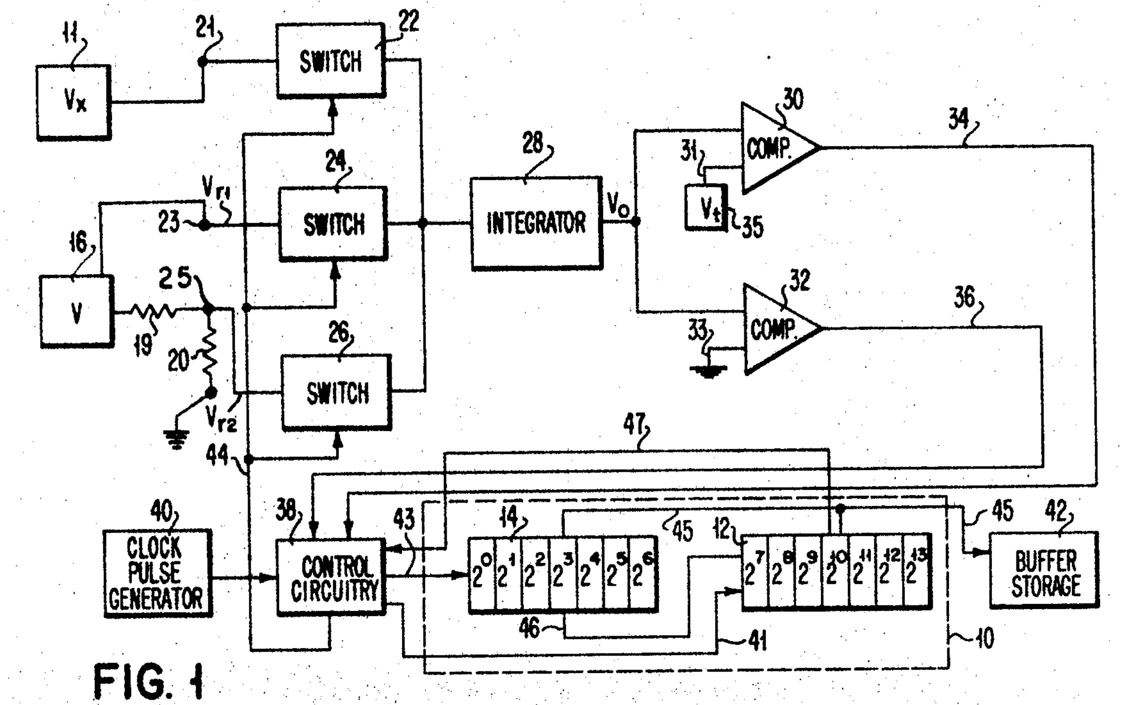
FIG. 1 is a block diagram of a preferred embodiment of my invention.

With reference to the drawings, FIG. 1 shows a preferred embodiment of my invention. That preferred embodiment is hereinafter referred to as a triple integrating ramp, analog-to-digital converter.

Looking initially at the apparatus of FIG. 1, an unknown analog voltage is to be converted to a digital number. Binary counter 10 ultimately contains a digital representation of unknown analog voltage $V_x$, shown emanating from a source 11. In this example, binary counter 10 is shown as a 14-bit counter, and it is partitioned into two sections; a first group 12 of higher order bit positions and a second group 14 of lower order bit positions. A voltage source 16 generates both a first reference voltage $V_{r1}$ at terminal 23 and a second reference voltage $V_{r2}$. $V_{r2}$ is made available at terminal 25 by passing a voltage V from voltage source 16 through resistor 19. Note that resistor 20 is grounded so as to form a typical voltage divider network. A plurality of switches 22, 24, 26 selectively gate voltages $V_x$, $V_{r1}$, $V_{r2}$ into integrator circuit 28. The output voltage $V_o$ of integrator 28, a ramp voltage, is supplied to comparator circuits 30, 32. The outputs of comparators 30, 32 are provided on lines 34, 36 respectively to control circuitry 38 which, in turn, gates clock pulses from clock pulse generator 40 into counter groups 12, 14 on lines 41, 43 respectively. An additional function of control circuitry 38 is to control the operation of switches 22, 24, 26 by signals on line 44. Completing the general description of the apparatus in FIG. 1, a buffer storage 42 responsive to signals from counter groups 12, 14 on line 45 can be provided; thus, the contents of counter 10 can be stored transitorily while a subsequent conversion cycle is implemented. Alternatively, the contents of counter 10 can be processed immediately.

Figure 2:
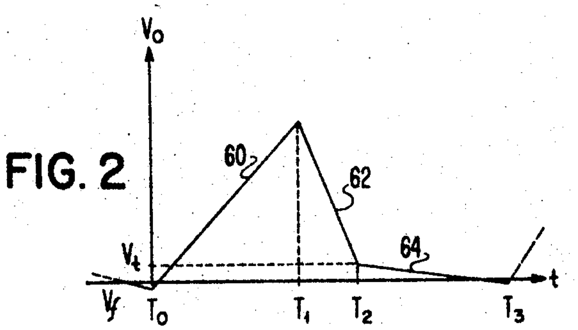
FIG. 2 is a voltage-time diagram showing the ramp voltages generated in my invention.

FIG. 2 shows a voltage-time plot of waveforms generated by the apparatus of FIG. 1. The operation of the apparatus set forth in FIG. 1 can be explained with the aid of FIG. 2; reference will be made to both FIGS. in the following description. In FIG. 2, the Y-axis represents the magnitude of the output voltage $V_o$ from integrator 28. The X-axis represents time transpired.

The conversion operation starts at a given initial time $T_o$ shown in FIG. 2. At time $T_o$ both groups 12 and 14 of counter 10 are in the zero state and switches 24, 26 are open. Switch 22 is closed by a signal generated by control circuitry 38 on line 44. An unknown analog input voltage $V_x$, applied at terminal 21, is then integrated by integrator 28 for a fixed period of time ($T_o$ to $T_1$ in FIG. 2) which is equal to the time required to fill counter group 12. Clock pulses from clock pulse generator 40 are gated into counter group 12 by control circuitry 38 on line 41; this will be described more fully with reference to FIGS. 5 and 6. Line 60 of FIG. 2 represents the ramp voltage $V_o$ generated at the output of integrator 28 in response to the unknown analog input voltage $V_x$ applied at terminal 21.

Continuing with reference to both FIG. 1 and FIG. 2, at time $T_1$ the integration of the unknown analog input voltage $V_x$ is halted. To halt the integration of $V_x$, control circuitry 38 receives a signal on line 47 indicating that group 12 of counter 10 is filled and generates signals on lines 44 for opening switch 22 and closing switch 24. At the same time, a clock pulse from clock pulse generator 40 is passed on line 41 to counter group 12 so as to reset counter group 12 to the zero state. The time integral of $V_x$ over the interval $T_0$ to $T_1$ is now stored in the integrator circuit 28. This is proportional to the magnitude of $V_x$. A reference voltage $V_{r1}$, generated by voltage supply 16 is now available at terminal 23. The polarity of $V_{r1}$ is opposite to that of $V_x$. Reference voltage $V_{r1}$ is integrated by integrator 28 for a variable period of time; in FIG. 2, line 62 extends from $T_1$ to $T_2$. The polarity of the slope of line 62 is opposite to the polarity of the slope of line 60. The time integral of $V_{r1}$ over the interval $T_1$ to $T_2$ is subtracted from the previously-noted time integral of $V_x$, leaving a reduced charge stored in integrator 28. Time $T_2$ is determined by the output $V_o$ of integrator 28 passing through a predetermined voltage level $V_t$. The optimum valve of $V_t$ is a function of how the counter is partitioned in the circuit. The minimum level of $V_t$ must be such that the following integration of $V_{r2}$ can continue over a time period sufficient to fill counter group 14 if required by the magnitude of the first input voltage. Otherwise, an incomplete conversion of $V_x$ will be present in counter 10. Comparator 30 has input 31 connected to a source 35 of voltage $V_t$ so as to note the occurrence of $V_o$ equaling $V_t$ and supply an output signal on line 34. In response to the output signal on line 34, control circuitry 38 stops the gating of clock pulses from clock pulse generator 40 into group 12 of counter 10. At this time, an approximate, low resolution conversion of the analog input signal $V_x$ to a digital value has been made. It is necessary now to complete the conversion.

To do this, control circuitry 38, in response to the signal on line 34 from comparator circuit 30, opens switch 24 and closes switch 26 (note that switch 22 stays open). At the same time, voltage source 16 is generating a second reference voltage $V_{r2}$ through resistors 19, 20 and this is supplied at terminal 25. This voltage $V_{r2}$ is lesser in magnitude than $V_{r1}$ and also of opposite polarity to $V_x$. Switch 26 conducts that reference voltage $V_{r2}$ to integrator 28 where a third ramp voltage represented by line 64 in FIG. 2 is generated. The polarity of the slope of line 64 is also opposite to the polarity of the slope of line 60. At the same time, control circuitry 38 gates pulses from clock pulse generator 40 into counter group 14, Integrator 28 will continue to generate a ramp voltage $V_o$ represented by line 64 in FIG. 2 until such time as that ramp voltage $V_o$ passes ground potential. This occurrence is tested by comparator circuit 32, set for that purpose by having input 33 grounded. This happens just prior to time $T_3$ shown in FIG. 2. Comparator circuit 32 generates an output signal on line 36 and this is supplied to control circuitry 38. In response to that signal, clock pulses from clock pulse generator 40 are halted;

that is, they are no longer supplied on line 43 to counter group 14. A carry signal, if needed, passes from counter group 14 to counter group 12 on line 46. Note that line 64 passes through zero before integration of $V_x$ is initiated again. This overshoot would normally be an error, but its effect is cancelled by the similar overshoot which occurred at time $T_0$. At time $T_3$ both counter groups 12, 14 have their individual bit positions set and, in the example shown, a 14-bit digital representation proportional to the magnitude of the unknown analog input voltage is contained in counter 10.

Note, that it has only taken approximately $3.2^{\frac{n}{2}}$ pulses from clock pulse generator 40 in the worst case to accomplish a complete conversion. First it takes $2^{\frac{n}{2}}$ pulses to fill counter group 12 during integration of $V_x$; then, it takes a maximum of $2^{\frac{n}{2}}$ pulses to refill counter group 12 during integration of $V_{r1}$; and, lastly, it may take slightly more than $2^{\frac{n}{2}}$ pulses to fill counter group 14 during integration of $V_{r2}$ (the excess pulses may occur due to the possibility of a carry pulse from counter group 14 to counter group 12 as will be explained with reference to control circuitry of FIG. 5). In the prior art dual integrating ramp, it would take a maximum of $2^{n+1}$ pulses. For a 14-bit counter, my invention in the worst case requires 384 pulses while the prior art in the worst case requires 32,768.

Since, in this preferred embodiment, it is desired to have the converter essentially free running so as to maximize the cancellation of errors within the circuitry, buffer storage 42 (for example, a magnetic core array) can be provided and control circuitry 38 can transfer the contents of counter 10 into buffer storage 42 on line 45. Alternatively, the contents of counter 10 can be processed immediately by associated equipment. Control circuitry 38 can then immediately reset switches 22, 24, 26 so as to begin the next conversion cycle; that is, switch 22 will be closed while switches 24, 26 will be open.

Summarizing for just a moment the operation of the ADC shown in FIGS. 1 and 2, an unknown analog input signal $V_x$ is integrated for a fixed period of time by integrator circuit 28. Curve 60 represents the resultant ramp voltage $V_0$. Then, a first reference voltage $V_{r1}$ of opposite polarity is integrated until the ramp represented by curve 62 crosses a predetermined voltage level $V_t$. The most significant positions of counter 10 (i.e., group 12) are set, although their setting may be modified subsequently. Next, a second reference voltage $V_{r2}$ is integrated by integrator 28, and a ramp voltage represented by curve 64 is generated. During this time, the least significant bit positions (i.e., group 14) of counter 10 are set, and bits of group 12 are modified by any carry signal from group 14. At time $T_3$ a 14-bit digital representation proportional to the magnitude of analog input voltage $V_x$ is contained in counter 10. Translated into more concrete terms, with a clock pulse frequency of 10 megacycles, one can make a 14-bit conversion at the rate of roughly 30,000 conversions per second; this is contrasted to a conversion rate of about 300 conversions per second for the same clock pulse frequency in the dual ramp converter of the prior art.

In this preferred embodiment, the number of bits in counter group 12 equals the number of bits in counter group 14 so as to achieve maximum speed of operation. However, that same speed could be obtained by partitioning the counter so that group 12 has six bit positions. Other possible partitions will result in less than maximum speed.

Having described the general operation of the apparatus as set forth in FIGS. 1 and 2, attention will be directed to a more particular showing of circuitry for accomplishing the various functions shown in the preferred embodiment. It should be understood that this circuitry is merely exemplary, and that other combinations of components for accomplishing known functions such as integration, switching, counting, etc. may be used with equal success in accordance with the knowledge of one skilled in the art to which this invention pertains.

Figure 3:
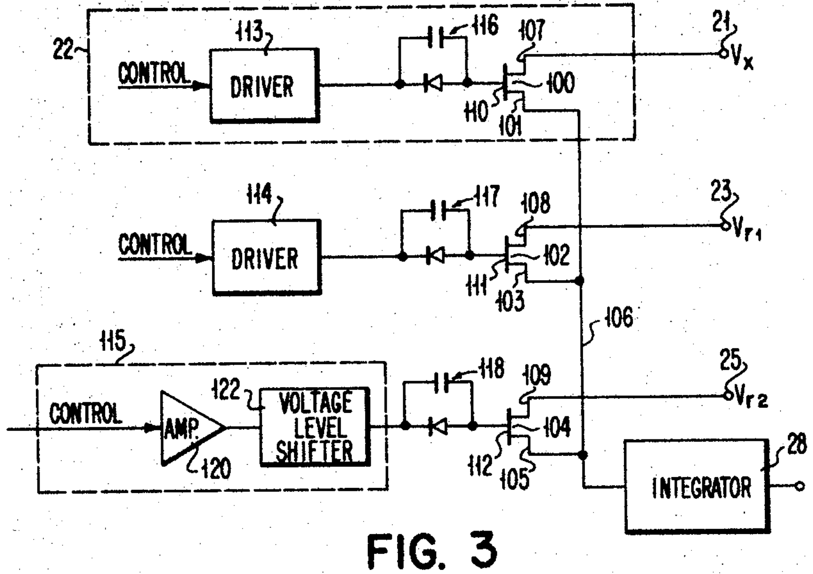
FIG. 3 shows suitable field-effect transistor gates and gate driver circuits for passing the input and reference voltages in my invention.

FIG. 3 shows one arrangement of embodying the functional switches 22, 24, 26 of FIG. 1; switch 22 is outlined in dotted lines. With reference to FIG. 3, three field-effect transistors (FET's) 100, 102, 104 are arranged in a parallel connection. One terminal 101, 103, 105 of each FET is connected via common connection 106 to integrator 28, also appearing in FIG. 1. Applied to the other terminal 107, 108, 109 of the FET's is the analog input voltage $V_x$, the first reference voltage $V_{r1}$, and the second reference voltage $V_{r2}$ through terminals 21, 23, 25 respectively. Connected to the gate 110, 111, 112 of each FET is an associated driver circuit 113, 114, 115 via an associated diode capacitor network 116, 117, 118. Each diode provides current limiting when the FET is forward biased and each capacitor is a "speedup capacitor" normally used in switching circuits to provide faster turn on. Driver circuit 115 is shown in more detail and may include a conventional differential amplifier 120 and a voltage level shifting device (e.g., a Zener diode) 122. Other suitable arrangements can be used; this circuit 115 is only exemplary. A control pulse from control circuitry 38 applied to a particular driver circuit 113, 114, 115 will render the associated FET 100, 102 or 104 conducting and the voltage applied to that FET (i.e., $V_x$, $V_{r1}$ or $V_{r2}$) will be passed on via conductor 106 to integrator 28. In an actual example, the FET's may be MC642 (manufactured by Crystalonics, Inc.); the diodes may be type CD5 (manufactured by Continental Devices, Inc.); and the capacitors may be a 220 microfarad mica capacitor. The integrator circuit 28 will be described in more detail with reference to FIG. 4.

Figure 4:
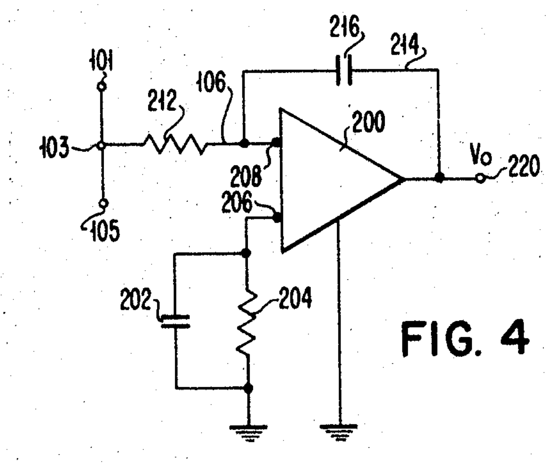
FIG. 4 shows an integrator circuit for incorporation in my invention.

With reference to FIG. 4, one suitable integrator circuit is shown; once again it should be recognized that other arrangements of integrating the input voltage may prove satisfactory. A differential amplifier 200 similar to Model 106 (manufactured by Analog Devices, Inc.) can be used. An RC network comprising a 500 picofarad capacitor 202 and a 20,000 ohm resistor 204 is disposed between a terminal 206 of amplifier 200 and ground. Connected to the other terminal 208 of amplifier 200 is line 106 with a 20,000 ohm resistor 212 therein; line 106 brings in a voltage from either switch 22, 24 or 26 (see FIGS. 1 and 3). Line 106 returns to terminals 101, 103, 105 of FET's 100, 102, 104 of FIG. 3. To complete the description of the integrator circuit, a feedback loop 214 including a 500 picofarad capacitor 216 is provided across the output of amplifier 200 and the input terminal 208. Thus, a voltage applied on line 106 can be changed to a ramp voltage available at output terminal 220; this is the voltage $V_0$ of FIG. 1.

Figure 5:
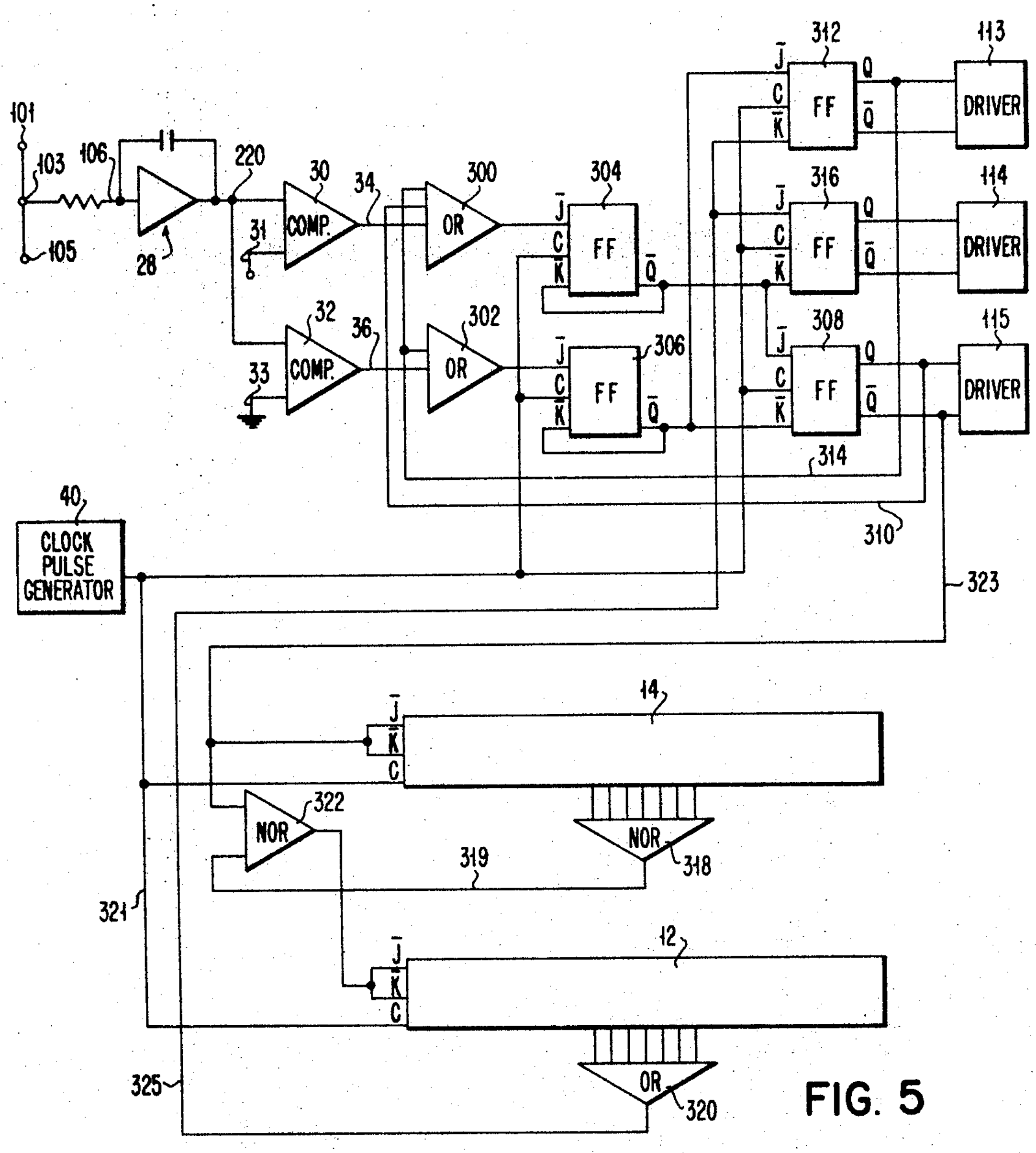
FIG. 5 shows control logic and counter circuitry suitable for a preferred embodiment of my invention.
Figure 6:
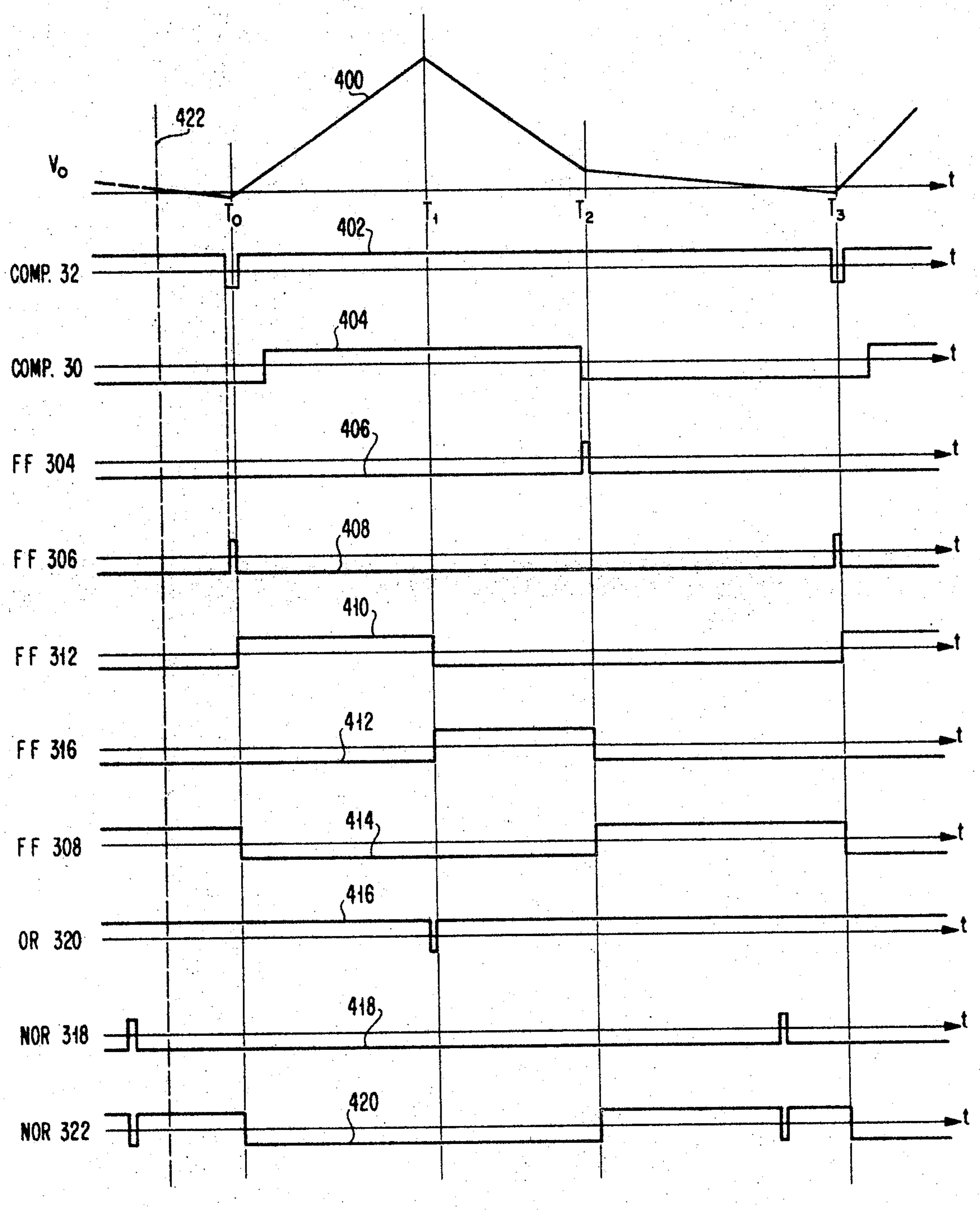
FIG. 6 shows a timing diagram for the circuitry of FIG. 5.

FIG. 5 shown suitable control circuitry for practicing the preferred, triple integrating ramp embodiment of my invention; also shown is a 14-bit position counter. FIG. 6, a timing diagram for the equipment shown in FIG. 5, will be referred to in describing FIG. 5.

Looking first at the structure of FIG. 5, note that integrator circuit 28 and comparator circuits 30, 32 and the associated inputs, etc. are repeated from preceding FIGS. Similarly, counter groups 12, 14 from FIG. 1 are shown as well as driver circuits 113, 114, 115 of FIG. 3.

Going from left to right across the upper half of FIG. 5, OR gates 300, 302 are disposed between comparator circuits 30, 32 and flip-flops 304, 306. Flip-flops hereinafter will be referred to by the letters FF followed by the identifying numeral from the drawing; e.g., FF306. The OR gate 300 is responsive to comparator circuit 30 as well as signals from FF308 on line 310; similarly, OR gate 302 is responsive to both comparator 32 and signals from FF312 on line 314. Note that line 314 from FF312 also is an input to OR gate 300. FF316 controls the operation of driver circuit 114. FF312 controls driver circuit 113 and FF308 controls driver circuit 115.

The function and operation of that circuitry already discussed will be made clearer subsequently. Note, however, that the primary purpose of that circuitry already shown is to energize the switches 22, 24, 26 (FIG. 1) in response to outputs from comparator circuits 30, 32 and counter groups 12, 14. The OR gates 300, 302 and FFs 304, 306 are essentially buffers between comparator circuits 30, 32 and FFs 308, 312, 316. Without such a buffer, it could happen that one comparator firing simultaneously to the occurrence of a clock pulse from clock pulse generator 40 could set one of FFs 308, 312, 316 but fail to reset another one. Since only one switch 22, 24, 26 (FIG. 1) should be on at one time, such a failure would cause an error.

The circuitry at the bottom half of FIG. 5 comprises counter groups 12, 14, a NOR gate 318, an OR gate 320, and another NOR gate 322. NOR gate 318, responsive to signals from counter group 14, changes state (e.g., goes high on its output line 319) for one clock pulse interval when counter group 14 is full; i.e., when counter group 14 is in the 11...1 state. NOR gate 322 is responsive to the output of NOR gate 318 and FF308 on line 323; NOR gate 318 cooperating with NOR gate 322 allows a carry pulse from clock pulse generator 40 to enter counter group 12 on line 321 whenever counter group 14 is full. OR gate 320 serves to turn off driver 113 by setting FF312 with a signal on line 325, opening switch 22 (FIG. 1) and stopping integration of $V_x$, the unknown analog input voltage. The OR gate 320 also serves to reset FF316 with the same signal on line 325, to energize driver circuit 114, and to close switch 24 so as to allow integration of $V_{r1}$.

Before leaving FIG. 5, it should be noted that a specific type, or family, of logic devices having what are known in the art as J and K inputs has been shown. That logic family is exemplified by MECL devices, marketed by Motorola. They operate according to the following truth table:

| $\bar{J}$ | $\bar{K}$ | C | Qn+1 |
|---|---|---|---|
| 0 | 0 | 1 | $\bar{Q}$n |
| 1 | 0 | 1 | 0 |
| 0 | 1 | 1 | 1 |
| 1 | 1 | 1 | Qn |

where:
$\bar{J}$ and $\bar{K}$ are input signals;
C are clock signals from clock pulse generator 40;
Qn and $\bar{Q}$n are present outputs (up-down);
Qn+1 is the next output resulting from the setting of $\bar{J}$ and $\bar{K}$.

Other logic devices could be used to implement control circuitry; that is a choice left to one skilled in the art.

Having set forth the structure of control circuitry 38 and discussed its function briefly, FIG. 6 will be used to explain more fully the operation of that circuitry. FIG. 6 is a timing diagram where the Y-ordinate is voltage level, and the X-ordinate represents time. Each of the curves set forth in FIG. 6 identifies the state, or output, of an associated device in FIG. 5. Each curve is numbered and identified initially according to the following tabulation:

| CURVE | DEVICE |
|---|---|
| **400** | Output voltage $V_o$ from integrator circuit **28** |
| **402** | Comparator circuit **32** |
| **404** | Comparator circuit **30** |
| **406** | FF**304** |
| **408** | FF**306** |
| **410** | FF**312** |
| **412** | FF**316** |
| **414** | FF**308** |
| **416** | OR gate **320** |
| **418** | NOR gate **318** |
| **420** | NOR gate **322** |

For purpose of illustration, the cycle of operation will be referenced to a starting time indicated by dashed vertical line 422 intersecting all *t* axes. Line 422 denotes a time just before the end of a full conversion cycle.

With reference then to FIG. 6 and, more particularly, that portion intersected by vertical line 422, curve 400 indicates that the lower order bit positions (i.e., group 14) of counter 10 are being filled; $V_{r2}$ is being integrated by integrator circuit 28. Comparator 30 will have already fired, since $V_t$, or the threshold voltage, will have been passed by the negative going ramp; this is indicated by curve 404 being in a down condition. By contrast, the ground level or reference level will not have been passed yet, and comparator 32 will not have changed the state of its output; this is indicated by curve 402, representing the output of comparator 32, being in its up condition. The outputs of FFs 304, 306, 312, 316 are all down at this time; thus, FET driver circuit 113 and 114 are not energized and switches 22, 24 are open. However, switch 26 is closed, since $V_{r2}$ is connected to integrator 28. Therefore, driver circuit 115 is energized and FF308 must have its output up. This is indicated by curve 414 being in its up level. Group 12 of counter 10 may not be filled; therefore, curve 416 representing the output of OR 320 is still in its up state and has not gone down. Similarly, NOR gate 322 is in its up state thereby inhibiting clock pulses entering counter group 12; see curve 420. NOR gate 318 is down as shown by curve 418, since counter group 14 is not full.

With continued reference to FIG. 6, at time $T_o$ the integration of $V_{r2}$ has been completed and a digital representation of $V_x$ is contained in groups 12, 14 of counter 10. This condition was sensed by the output of comparator 32 going down just before time $T_o$ as shown by curve 402 of FIG. 6. Similarly, FF306 (curve 408) must go up so as to set FF308 (curve 414) in the down state thereby deenergizing driver circuit 115 and opening switch 26. At the same time, FF312 must be set to its up state so as to energize driver circuit 113 and close switch 22; this is shown by curve 410 going to its up level. Note that FF316 (curve 412) does not change state because driver circuit 114 should stay deenergized. At time $T_o$ the contents of counter groups 12, 14 are transferred to associated equipment as noted earlier, and counter groups 12, 14 are reset. This resetting operation can be initiated in response to any of the level transitions occurring at time $T_o$. NOR gate 322 goes from its up to its down level as indicated by curve 420 because of the change in state of FF308 for the next integration of $V_x$; this allows clock pulses to be gated into group 12 of counter 10.

During time period $T_o$ to $T_1$, integrator circuit 28 is integrating voltage $V_x$ and curve 400 shows a positive going ramp voltage being generated. At time $T_1$ the positions of counter group 12 are all filled and OR 320 has changed its output from up to down; see curve 416 of FIG. 6. At the same time, it is necessary to close switch 24, open switch 22, and clear the contents of counter group 12. As a result of OR 320 changing state, FF316 goes to its up state as indicated by curve 412; FF312 by contrast goes to its down state as indicated by curve 410. Since NOR 322 is in its down state, subsequent clock pulses are going to enter counter group 12.

Between time $T_1$ and $T_2$ reference voltage $V_{r1}$, of opposite polarity to $V_x$, is integrated by integrator circuit 28. As the negative-going ramp passes through $V_t$, the threshold voltage level, comparator circuit 30 changes state, and its output goes down. This is indicated by curve 404 of FIG. 6. At that time, $T_2$, it is necessary to open switch 24 and close switch 26. Switch 24 is opened by deenergizing driver circuit 114 in response to a change in state of FF316; note curve 412 goes down at this time. Similarly, it is necessary to close switch 26 and this is implemented by energizing driver circuit 115; see curve 414 indicating that FF308 goes to its up state. These actions are in response to the change in state of FF304 (curve 406), whose state has been altered by an output signal from OR 300. At this time, counter group 12 will have the higher order digits corresponding to the approximate digital value for $V_x$ stored therein. The output of NOR 322 (curve 420) goes up, as a result of FF308 changing state, so as to prevent clock pulses from entering group 12.

With continued reference to FIG. 6, the integration of $V_{r2}$ proceeds from time $T_2$ to $T_3$; curve 400 shows the negative-going ramp corresponding to the integration of that voltage. During this time period, note that curve 418 can go from down to up level indicating that NOR gate 318 has changed its state momentarily; at the same time NOR gate 322 would go down momentarily. This will happen if counter group 14 is filled before time $T_3$ and allows a carry pulse to enter counter group 12; this carry pulse is nothing more than a clock pulse.

At time $T_3$ the negative-going ramp of curve 400 passes through the zero or ground level and this is sensed by comparator circuit 32; the output of comparator circuit 32 (curve 402) then goes down. Since FF312 is down, the output of OR gate 302 goes down when the output of comparator circuit 32 changes thereby changing the state of FF306; see curve 408 where the output of FF306 changes state. As a result of FF306 changing state, FF312 is set to its up state (curve 410), thereby energizing driver circuit 113 and closing switch 24. For the same reason, FF308 goes from an up to a down level so as to deenergize driver circuit 115 and to open switch 26; see curve 414.

Thus, a cycle of operation of the apparatus set forth in FIGS. 5 and 6 has been shown. The cycle of operation is repeated on a continuous basis.

In recapitulation, a preferred triple integrating ramp embodiment of my invention has been set forth. It should be recognized that other embodiments are possible. For example, the concept of my invention can be extended by providing a plurality of reference voltages. If one provides N reference voltages, then one must provide N+1 switches and N comparator circuits so as to handle the switching of the reference voltages into the integrator circuit and to sense the completion of the corresponding ramp voltage generated by the integrator circuit. As in the preferred embodiment, a means of measuring the various time intervals, such as a counter, must be provided; also, a mathematical relationship exists between these time intervals and the values of the various reference voltages. As noted earlier, and as can be proven mathematically, the triple integrating ramp embodiment wherein the counter is divided into two groups of bit positions appears to offer the greatest increase in speed over the prior art with the least expensive arrangement of components.

Similarly, the invention can be extended to accommodate bipolar input signals in several different ways. For example, suitable circuitry for sensing the polarity of the input signal and adjusting the polarity of the reference signal can be provided. Another way is to provide an offset voltage at the input of the integrator. In addition, the number of bits in the counter must then be increased by 1. These changes are implemented so that if $V_x$ equals zero, the number in the counter will be 100...0. If $V_x$ is greater than zero, the most significant bit in the counter will be 1 followed by bits determined in the same fashion as in the preferred embodiment. If $V_x$ is less than zero, the most significant bit will be 0 and the remaining bits in the counter will be a 2's complement representation of the unknown voltage $V_x$. Thus, the most significant bit, which was added to the counter, serves as a sign bit. It is sufficient for the reference voltages to be of opposite polarity to the input voltage; in any case, it is necessary for the ramp generated in response to the reference voltages to be of oppositely-signed slope to the slope of the ramp generated in response to integration of the unknown analog input voltage.

The concept of my invention can also be adapted to operate in a current mode environment. For example, the input quantity may be a current $I_x$ instead of a voltage and the references might be current reference sources. Then, gating devices suitable for accommodating currents can be provided. Another minor modification comprises substituting an AC amplifier in the conventional integrator shown in FIG. 4.

It should be recognized that the clock pulse generator–counter arrangement set forth in the discussion of the preferred embodiment of my invention is a convenient way (or means) of establishing and measuring precise time intervals needed in my invention. Other means could be provided by one skilled in the art to which this invention pertains in order to accomplish these functions.

It should be recognized also that the phrase "the counter contains a digital representation of the magnitude of the analog input signal $V_x$" is terminology common to the art of ADC's. In this case, its meaning is as follows. The number in counter 10 at the end of a conversion cycle is given by equation 1:

$$N=N_1+N_2 \qquad (1)$$

where:

$N$ = final number in counter 10

$N_1$ = number accumulated during integration of $V_{r1}$ $N_2$ = number accumulated during integration of $V_{r2}$ The number $N$ is related to the absolute value of $V_x$ by equation 2:

$$V_x=\frac{N}{N_0}V_{r1} \qquad (2)$$

where:

$V_x$ = absolute value of analog input signal $N$ is defined by equation 1

$N_0=2^x$ where $x$ is the number of bits in counter 10 in the preferred embodiment.

$V_{r1}$ = first reference voltage.

Equipment normally associated with ADC's can operate on the number N; it may, or may not, convert N into the absolute value of the unknown voltage $V_x$. That is a matter of design convenience.

While the invention has been shown and described with reference to preferred embodiments thereof, it will be understood by those skilled in the art that the foregoing and other changes of form and detail may be made therein without departing from the spirit and scope of the invention.

I claim:

1. Analog-to-digital conversion apparatus for converting an analog signal of unknown magnitude into a digital representation of the magnitude of said signal comprising in combination:

means for receiving said analog signal of unknown magnitude;

reference signal generating means for generating a plurality of reference signals;

integrating means; control means for introducing said analog signal to said integrating means for a fixed time period and for storing the integrated value of said analog signal, said control means including means for sequentially introducing and removing each of said reference signals to said integrating means; and means for measuring the total time required for the integrated value of said sequentially applied reference signals to acquire a magnitude related to the stored integrated value of said analog signal;

whereby said total time represents the digital magnitude of said analog signal.

2. Analog-to-digital conversion apparatus of tee type set forth in claim 1 wherein said measuring means includes a counter having a plurality of groups operable during the integration of a respective said reference signal, said apparatus further including, means for sensing that the output of said integrating means exceeds at least one preselected transition level, and for producing an output whenever said integrating means output passes said transition level.

said control means being responsive to said sensing means output for selectively switching said reference signals relative to said integrating means.

3. Analog-to-digital conversion apparatus of the type set forth in claim 2 including:

means for generating a plurality of clock pulses; and gating means for gating said clock pulses into the said group of said counter associated with the said reference signal being integrated by said integrating means.

4. Analog-to-digital conversion apparatus of the type set forth in claim 3 wherein:

said reference signal generating means generates first and second reference signals, said counter includes first and second groups associated with said first and second reference signals respectively;

said apparatus further including means for generating a carry pulse when said second group of positions is full; and means for summing said carry pulse from said second group to said first group.

5. Analog-to-digital conversion apparatus of the type set forth in claim 4 wherein said integrating means generates output signals and said sensing means include a plurality of comparator means, each of said comparator means serving to compare said output signals of said integrating means to different predetermined levels, and each said comparator means generating comparator output signals upon noting an equality between said signals of said integrating means and one said predetermined level.

6. Analog-to-digital conversion apparatus of the type set forth in claim 5 wherein each of said groups comprises bit positions and each of said bit positions can be in one of two states; and further comprising;

means for selectively switching said analog signal and said reference signals to said integrating means; and said control means being responsive to said comparator output signals and to the state of said bit positions, said control means generating control signals at least for first energizing said switching means connecting said analog signal generating means to said integrating means, for then energizing said switching means connecting said (*a*) first of said reference signals to said integrating means, and subsequently for energizing said switching means connecting said (*a*) second of said reference signals to said integrating means.

7. Analog-to-digital conversion apparatus of the type set forth in claim 6 wherein said comparator means includes first and second comparator circuits, said first comparator circuit generating one said comparator output signal when the output of said integrating means passes a first predetermined voltage level, and said second comparator circuit providing another said comparator output signal when said output of said integrating means passes through a second predetermined voltage level.

8. Analog-to-digital conversion apparatus comprising in combination:

means for receiving an analog signal;

means for generating a digital representation of said analog signal; said last-mentioned means having at least a first and second group of bit positions;

means for integrating said analog signal over a fixed period of time, thereby generating a first ramp voltage;

means for storing said integrated analog signal;

means for generating a first reference signal;

means for integrating said first reference signal thereby generating a second ramp voltage of polarity opposite to the polarity of said first ramp voltage and for reducing said stored integrated signal thereby;

means for generating clock signals;

means for entering said clock signals into said first group of bit positions during integration of said first reference signal;

means for generating a second reference signal;

means for integrating said second reference signal thereby generating a third ramp voltage of polarity opposite that of said first ramp voltage, and for further reducing said stored integrated signal thereby;

means for entering said clock signals into said second group of bit positions during integration of said second reference signal, thereby generating a digital representation of said analog signal.

9. Analog-to-digital conversion apparatus of the type set forth in claim 8 and comprising in addition:

means for generating a carry pulse when said second group of bit positions is full; and means for summing said carry pulse from said second group of bit positions to said first group of bit positions.

10. Analog-to-digital conversion apparatus wherein an analog signal of unidentified magnitude is converted to a digital number representing the magnitude of said analog signal, comprising in combination:

digital number storing means for storing said digital number;

means for generating a first voltage representing the time integral of said analog signal over a fixed time period, said time integral being defined as a first time integral;

means for storing said first time integral of said analog signal;

means for generating a plurality of reference signals;

means for integrating said reference signals;

means for generating a second voltage representing the reduction of said first time integral by the time integral of one said reference signal;

pulse generating means for generating a plurality of constant frequency pulses;

means for entering a first plurality of said pulses into said digital number storing means during said reduction of said first time integral by the time integral of one said reference signal;

means for generating a third voltage representing the further reduction of said first time integral by the time integral of another of said reference signals; and means for entering a second plurality of said pulses into said digital number storing means during said further reduction of said first time integral, thereby completing the conversion of said analog signal to said digital number.

11. Analog-to-digital conversion apparatus of the type set forth in claim 10 wherein said digital number storing means is partitioned into at least a first group of bit positions and a second group of bit positions and said analog-to-digital conversion apparatus comprises in addition:

means for gating said first plurality of pulses into said first group of bit positions; and means for gating said second plurality of pulses into said second group of bit positions.

12. Analog-to-digital conversion apparatus of the type set forth in claim 11 wherein said digital number storing means comprises a binary counter, said first group of bit positions comprises the higher order positions of said binary counter, and said second group of bit positions comprises the lower order bit positions of said binary counter.

13. Analog-to-digital conversion apparatus of the type set forth in claim 12 wherein said gating means includes a plurality of comparator means, one said comparator means comparing said second voltage to one predetermined level and another said comparator means comparing said third voltage to another predetermined level.

14. Analog-to-digital conversion apparatus wherein an analog signal of unidentified magnitude is converted to a digital number representing the magnitude of said analog signal, comprising in combination:

digital number storing means for storing said digital number;

means for generating a first voltage representing the time integral of said analog signal over a fixed time period, said time integral being defined as a first time integral;

means for storing said first time integral of said analog signal;

means for generating a plurality of reference signals;

means for generating a second voltage representing the time integral of one said reference signal, said last-mentioned time integral being defined as a second time integral;

means for subtracting said second time integral from said first time integral, thereby generating a difference integral;

pulse generating means for generating a plurality of constant frequency pulses;

means for entering a first plurality of said pulses into said digital number storing means during subtraction of said second time integral from said first time integral;

means for generating a third voltage representing the time integral of another of said reference signals, said last-mentioned time integral being defined as a third time integral;

means for subtracting said third time integral from said first difference integral; and means for entering a second plurality of said pulses into said digital number storing means thereby completing the conversion of said analog signal to said digital number.